United States Patent
Chen et al.

(10) Patent No.: US 7,449,916 B2
(45) Date of Patent: Nov. 11, 2008

(54) VOLTAGE LEVEL SHIFT CIRCUIT

(75) Inventors: Chien-Ru Chen, Tainan County (TW); Ying-Lieh Chen, Tainan County (TW); Lin-Kai Bu, Hsinhua Township, Tainan County (TW); Yu-Jui Chang, Hsinhua Township, Tainan County (TW)

(73) Assignee: Himax Technologies Limited, Tainan County (TW)

( * ) Notice: Subject to any disclaimer, the term of this patent is extended or adjusted under 35 U.S.C. 154(b) by 77 days.

(21) Appl. No.: 11/417,372

(22) Filed: May 3, 2006

(65) Prior Publication Data
US 2007/0222478 A1   Sep. 27, 2007

(30) Foreign Application Priority Data
Mar. 24, 2006 (TW) .............................. 95110237 A

(51) Int. Cl.
*H03K 19/094* (2006.01)
*H03K 19/0175* (2006.01)
*H03L 5/00* (2006.01)

(52) U.S. Cl. ............................ 326/68; 326/83; 327/333

(58) Field of Classification Search .................. 326/62, 326/68, 80–87; 327/108–109, 333
See application file for complete search history.

(56) References Cited

U.S. PATENT DOCUMENTS

| 6,522,323 | B1 | 2/2003 | Sasaki et al. | 345/204 |
| 6,710,638 | B2 * | 3/2004 | Morikawa | 327/333 |
| 6,856,163 | B2 * | 2/2005 | Sutardja | 326/30 |
| 2005/0024088 | A1 * | 2/2005 | Lee | 326/81 |
| 2005/0270066 | A1 * | 12/2005 | Kozawa | 326/81 |

* cited by examiner

*Primary Examiner*—Rexford Barnie
*Assistant Examiner*—Dylan White
(74) *Attorney, Agent, or Firm*—J.C. Patents

(57) ABSTRACT

A voltage level shift circuit is provided. The circuit includes an input buffer unit, a level shift unit and a voltage stabilizing capacitor. The input buffer is coupled between a first voltage source and a first ground terminal. The level shift unit is coupled between a second voltage source and a second ground terminal. An input terminal of the level shift unit is coupled to an output terminal of the input buffer unit. The voltage stabilizing capacitor is coupled between the first voltage source and the second ground terminal. When a state transition occurs in the level shift unit, the voltage stabilizing capacitor maintains a voltage difference between the output terminal of the input buffer unit and the second ground terminal.

8 Claims, 1 Drawing Sheet

VOLTAGE LEVEL SHIFT CIRCUIT

CROSS-REFERENCE TO RELATED APPLICATION

This application claims the priority benefit of Taiwan application ser. no. 95110237, filed on Mar. 24, 2006. All disclosure of the Taiwan application is incorporated herein by reference.

BACKGROUND OF THE INVENTION

1. Field of the Invention

The present invention relates to a voltage level shift circuit, and more particularly, to a voltage level shift circuit having a stabilizing capacitor.

2. Description of Related Art

In some applications of the liquid crystal display (LCD) driver integrated each of which further comprises a plurality of data bits. Therefore, when there is a state transition in the voltage level shift circuit, these causes a problem of pulling up the ground terminal voltage, which affects the state transition of the voltage level shift circuit.

SUMMARY OF THE INVENTION

Accordingly, at least one objective of the present invention is to provide a voltage level shift circuit that utilizes a capacitor coupling effect of a stabilizing capacitor to maintain a voltage difference between an output voltage of an input buffer unit and the ground terminal of a level shift unit, thereby sustaining state transition capacity of the voltage level shift circuit.

To achieve these and other advantages and in accordance with the purpose of the invention, as embodied and broadly described herein, the invention provides a voltage level shift circuit. The circuit comprises an input buffer unit, a level shift unit and a stabilizing capacitor. The input buffer is coupled between a first voltage source and a first ground terminal. The level shift unit is coupled between a second voltage source and a second ground terminal. An input terminal of the level shift unit is coupled to an output terminal of the input buffer unit. The voltage stabilizing capacitor is coupled between the first voltage source and the second ground terminal for maintaining a voltage difference between the output terminal of the input buffer unit and the second ground terminal when a state transition occurs in the level shift unit.

In one embodiment, the foregoing level shift unit includes a first P-type transistor, a second P-type transistor, a first N-type transistor and a second N-type transistor. The first P-type transistor and the first N-type transistor are serially coupled between the second voltage source and the second ground terminal. The second P-type transistor and the second N-type transistor are serially coupled between the second voltage source and the second ground terminal. The gate of the first P-type transistor is coupled to a first node between the second P-type transistor and the second N-type transistor. The gate of the second P-type transistor is coupled to a second node between the first P-type transistor and the first N-type transistor. Furthermore, the gate of the first N-type transistor is the input terminal of the level shift unit. The first shared contact point between the second P-type transistor and the second N-type transistor is the output terminal of the level shift unit.

In one embodiment, the signals received by the gate of the foregoing first N-type transistor and the gate of the foregoing second N-type transistor are complementary. Furthermore, the voltage value of the foregoing first voltage source is smaller than that of the second voltage source.

In the present invention, a stabilizing capacitor is used so that, when the ground terminal of the level shift circuit has a change in potential due to a transition of the voltage, the source voltage of the input buffer unit is adjusted accordingly. Thus, the output voltage of the input buffer unit is maintained at the same driving capability for sustaining a state transition in the level shift circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
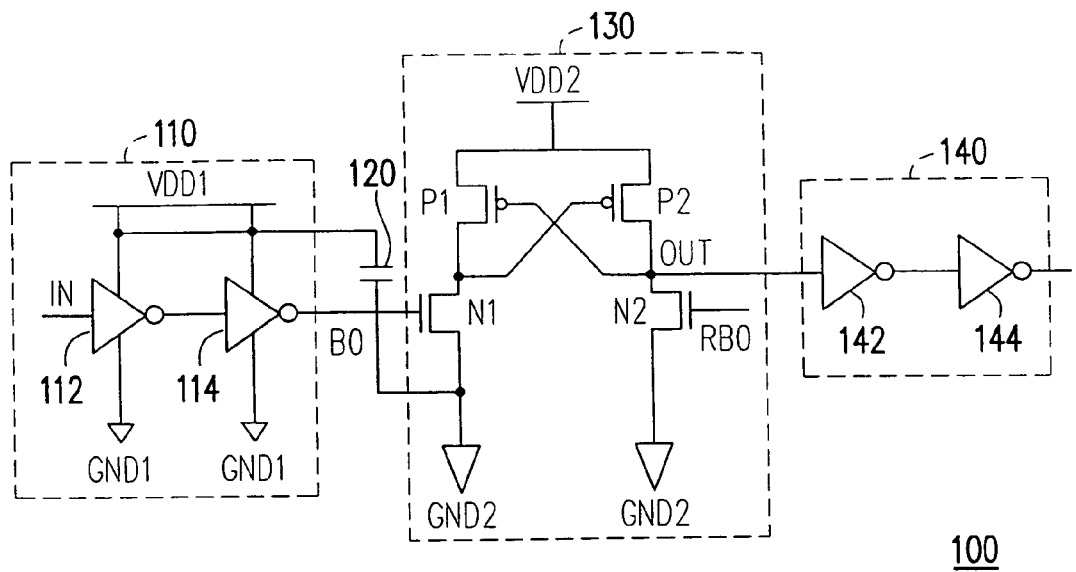
FIG. 1 is a diagram of a voltage level shift circuit according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a diagram of a voltage level shift circuit according to one embodiment of the present invention. As shown in FIG. 1, the voltage level shift circuit 100 includes an input buffer unit 110, a stabilizing capacitor 120, a level shift unit 130 and an output buffer unit 140. The input buffer unit 110 is coupled between a first voltage source VDD1 and a first ground terminal GND1. An output terminal of the input buffer unit 110 is coupled to an input terminal of the level shift unit 130. The stabilizing capacitor 120 is coupled between the first voltage source VDD1 and a second ground terminal GND2. An input terminal of the output buffer unit 140 is coupled to an output terminal of the level shift unit 130.

The level shift unit 130 further includes a first and a second P-type transistors (PMOS transistors, for short) P1, P2 and a first and a second N-type transistors (NMOS transistor, for short) N1, N2. The first PMOS transistor P1 and the first NMOS transistor N1 are serially coupled between a second voltage source VDD2 and the second ground terminal GND2. The second PMOS transistor P2 and the second NMOS transistor N2 are serially coupled to the second voltage source VDD2 and the second ground terminal GND2. The gate of the first PMOS transistor P1 is coupled to a first node between the second PMOS transistor P2 and the second NMOS transistor N2. The gate of the second PMOS transistor P2 is coupled to a second node between the first PMOS transistor P1 and the first NMOS transistor N1. The gate of the first NMOS transistor N1 is an input terminal of the level shift unit 130 for receiving an output signal BO from the input buffer unit 110. The gate of the second NMOS transistor N2 is another input terminal of the level shift unit 130 for receiving a complementary signal RBO. In the present embodiment, the complementary signal RBO is a complementary signal of the output signal BO from the output buffer unit 110. The first node between the second PMOS transistor P2 and the second NMOS transistor N2 is an output terminal of the level shift unit 130.

In one embodiment, the input buffer unit 110 comprises two inverters 112 and 114. As shown in FIG. 1, the inverters 112, 114 are coupled between the first voltage source VDD1 and the first ground terminal GND1. The output terminal of the inverter 112 is coupled to the input terminal of the inverter 114. The output terminal of the inverter 114 is coupled to the gate of the NMOS transistor N1. The output buffer unit 140 comprises two inverters 142 and 144. The inverter 142 is coupled between the output terminal of the level shift unit 130 and the inverter 144.

When the voltage level shift circuit 100 needs to transform an input voltage IN having a lower voltage level to an output voltage OUT having a higher voltage level, the input voltage IN generates an output signal BO after passing through the inverters 112 and 114. Then, the output signal BO is used to drive the first NMOS transistor N1. When the first NMOS transistor N1 conducts, the second PMOS transistor P2 conducts as a result of the lowered gate voltage. Hence, the level shift unit 130 outputs an output voltage OUT substantially close to the voltage value of the second voltage source VDD2 via the output terminal (the first node point between the second PMOS transistor P2 and the second NMOS transistor N2). Because the voltage at the second voltage source VDD2 in the present embodiment is higher than the voltage at the first voltage source VDD1, the output voltage OUT is higher than the input voltage IN. Next, the output voltage OUT is output after passing through the inverters 142 and 144, wherein the voltage value of the output voltage OUT is greater than the voltage value of the input voltage IN.

However, in applying to a liquid crystal display driving circuit, multiple groups of voltage level shift circuits 100 are simultaneously used for shifting the voltage level. Therefore, a voltage pull-up of the second ground terminal GND2 may occur due to a substantial current's flowing through a conductive wire with some parasitic resistances when the voltage level shift circuit 100 needs to perform a state transition (for example, from a low voltage to a high voltage). As a result, the voltage difference between the gate and the source of the first NMOS transistor N1 is reduced and the channel resistance is increased so that the state transition in the voltage level shift circuit 100 is affected. Thus, in the present embodiment, a stabilizing capacitor 120 is added to improve the situation. When the voltage of the second ground terminal GND2 increases due to the state transition, the stabilizing capacitor 120 disposed between the first voltage source VDD1 and the second ground terminal GND2 generates a voltage coupling effect so that the voltage value of the first voltage source VDD1 is substantially increased simultaneously. As the voltage value of the first voltage source VDD1 increases, the output voltage of the inverter 114 also increases. Hence, the driving voltage of the first NMOS transistor N1 (the voltage difference between the gate and the source) is maintained so that the state transition of the voltage level shift circuit 100 can be effected smoothly.

Figure 2:
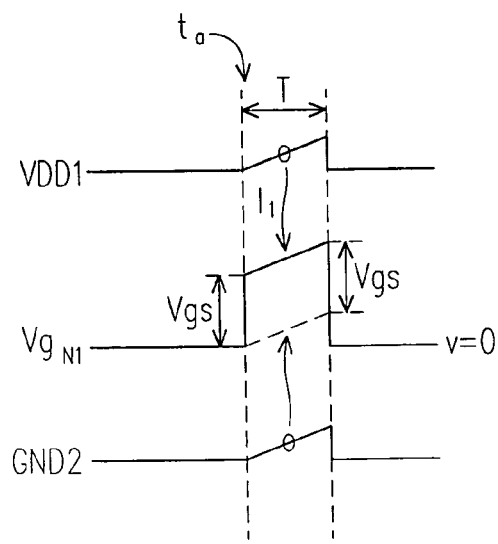
FIG. 2 is a diagram showing waveforms of all major signals according to the present embodiment.

FIG. 2 is a diagram showing the waveform of all major signals according to the present embodiment. As shown in FIGS. 1 and 2, when the voltage level shift circuit 100 initiates a state transition (at time $t_a$), the gate voltage $V_{gN1}$ of the first NMOS transistor N1 changes from a low voltage level to a high voltage level. Thus, the voltage value of the second ground terminal GND2 increases and leads to an increase in the voltage at the source terminal of the first NMOS transistor N1 as indicated by the signal waveform of the second ground terminal GND2 in FIG. 2. In the present embodiment, the stabilizing capacitor 120 is coupled between the first voltage source VDD1 and the second ground terminal GND2. Therefore, through the voltage coupling effect of the stabilizing capacitor 120, when the voltage value of the second ground terminal GND2 increases, the voltage value of the first voltage source VDD1 increases correspondingly and also leads to an increase in the gate voltage $V_{gN1}$ of the first NMOS transistor N1 as indicated by the index $I_1$. Thus, during the transition period T, the voltage different $V_{gs}$ between the gate and the source of the NMOS transistor is maintained at an identical level so that the driving capability of the first NMOS transistor N1 is sustained to complete the state transition in the voltage level shift circuit 100.

The present invention uses a stabilizing capacitor to adjust the output voltage of the input buffer unit according to the change in the ground terminal voltage so that the state transition driving capability of the level shift unit can be maintained. Thus, the voltage level shift circuit can complete the state transition smoothly.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage level shift circuit, comprising:
    an input buffer unit, coupled between a first voltage source and a first ground terminal;
    a level shift unit, coupled between a second voltage source and a second ground terminal, wherein an input terminal of the level shift unit is coupled to an output terminal of the input buffer unit; and
    a capacitor, coupled between the first voltage source and the second ground terminal for maintaining a voltage difference between the output terminal of the input buffer unit and the second ground terminal.

2. The voltage level shift circuit of claim 1, wherein the input buffer unit comprises a first inverter coupled between the first voltage source and the first ground terminal such that an output terminal of the first inverter is the output terminal of the input buffer unit.

3. The voltage level shift circuit of claim 2, wherein the input buffer unit comprises a second inverter coupled between the first voltage source and the first ground terminal such that an output terminal of the second inverter is coupled to an input terminal of the first inverter.

4. The voltage level shift of claim 1, wherein the level shift unit comprising:
    a first P-type transistor, wherein the first P-type transistor and a first N-type transistor are serially coupled between the second voltage source and the second ground terminal; and
    a second P-type transistor, wherein the second P-type transistor and a second N-type transistor are serially coupled between the second voltage source and the second ground terminal;
    wherein the gate of the first P-type transistor is coupled to a first node between the second P-type transistor and the second N-type transistor, the gate of the second P-type transistor is coupled to a second node between the first P-type transistor and the first N-type transistor, and furthermore, the gate of the first N-type transistor is the input terminal of the level shift unit and the first node between the second P-type transistor and the second N-type transistor is an output terminal of the level shift unit.

5. The voltage level shift circuit of claim 4, wherein the gate of the first N-type transistor and the gate of the second N-type transistor receive complementary signals.

6. The voltage level shift circuit of claim 1, wherein the level shift unit comprises an output buffer unit having an input terminal coupled to an output terminal of the level shift unit.

7. The voltage level shift circuit of claim 6, wherein the output buffer unit comprising:

a third inverter having an input terminal coupled to the output terminal of the level shift unit; and a fourth inverter having an input terminal coupled to an output terminal of the third inverter.

8. The voltage level shift circuit of claim 1, wherein the voltage value of the first voltage source is smaller than that of the second voltage source.

\* \* \* \* \*